(12) United States Patent
Lisart et al.

(10) Patent No.: US 8,397,152 B2
(45) Date of Patent: Mar. 12, 2013

(54) METHOD OF DETECTING AN ATTACK BY FAULT INJECTION ON A MEMORY DEVICE, AND CORRESPONDING MEMORY DEVICE

(75) Inventors: Mathieu Lisart, Aix En Provence (FR); Julien Mercier, Meyreuil (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 261 days.

(21) Appl. No.: 12/815,684

(22) Filed: Jun. 15, 2010

(65) Prior Publication Data
US 2010/0318885 A1 Dec. 16, 2010

(30) Foreign Application Priority Data
Jun. 16, 2009 (FR) ...................... 09 54025

(51) Int. Cl.
*H03M 13/09* (2006.01)
*G06F 11/10* (2006.01)
(52) U.S. Cl. ...................... 714/805; 714/799
(58) Field of Classification Search .............. 714/799, 714/805
See application file for complete search history.

(56) References Cited

U.S. PATENT DOCUMENTS

| 3,286,235 | A | 11/1966 | Sinn | |
|---|---|---|---|---|
| 6,886,116 | B1 * | 4/2005 | MacLellan et al. | 714/703 |
| 7,529,999 | B2 * | 5/2009 | Janke et al. | 714/734 |
| 7,584,386 | B2 * | 9/2009 | Bancel et al. | 714/45 |
| 7,747,935 | B2 * | 6/2010 | Bancel et al. | 714/819 |
| 7,747,936 | B2 * | 6/2010 | Pistoulet | 714/820 |
| 7,768,318 | B2 * | 8/2010 | Bancel et al. | 327/20 |
| 7,788,506 | B2 * | 8/2010 | Bancel et al. | 713/193 |
| 7,904,775 | B2 * | 3/2011 | Bancel et al. | 714/732 |
| 7,934,265 | B2 * | 4/2011 | Bancel et al. | 726/27 |
| 8,181,100 | B1 * | 5/2012 | Purdham et al. | 714/819 |
| 2003/0217323 | A1 | 11/2003 | Guterman et al. | 714/763 |
| 2005/0229060 | A1 | 10/2005 | Cochran et al. | 714/733 |
| 2008/0151669 | A1 | 6/2008 | Bill et al. | 365/222 |
| 2009/0113546 | A1 * | 4/2009 | Kim et al. | 726/22 |
| 2009/0315603 | A1 * | 12/2009 | Bancel et al. | 327/202 |
| 2010/0082927 | A1 * | 4/2010 | Riou | 711/163 |

\* cited by examiner

*Primary Examiner* — James C Kerveros
(74) *Attorney, Agent, or Firm* — Allen, Dyer, Doppelt, Milbrath & Gilchrist, P.A.

(57) ABSTRACT

A memory device may include a memory plane including a group of memory cells configured to store a block of bits including data bits and parity bits, and a detector for detecting a fault injection including a reader to read each bit, and a first checker to perform, when reading a block, a parity check based on the read value of each data and parity bit. The memory plane may include reference memory cells arranged between some of the memory cells to create packets of m memory cells. Each reference memory cell may store a reference bit and each packet of m memory cells may store m bits of the associated block, when m is greater than 1, with different parities. The detector may further include a second checker to perform, when reading the block, a check on the value of each reference bit.

10 Claims, 6 Drawing Sheets

METHOD OF DETECTING AN ATTACK BY FAULT INJECTION ON A MEMORY DEVICE, AND CORRESPONDING MEMORY DEVICE

FIELD OF THE INVENTION

The invention relates, generally, to electronic circuits, and more particularly to the detection of an attack by fault injection on a memory device. The invention applies advantageously but in a nonlimiting way to chip cards and to the protection of the confidential data that they contain.

BACKGROUND OF THE INVENTION

Among the possible attacks made by hackers to extract confidential data from a memory, for example, protected memory of a chip card, there are the attacks by fault injection (DFA or "Differential Fault Analysis") that aim to disrupt the operation and/or the content of the memory, for example, by means of radiation (laser, infrared, X-rays, etc.).

It therefore may be particularly useful to be able to detect such an attack by fault injection. Once the attack is detected, there may be many approaches depending on the application for either blocking the component, preventing the sensitive data from being handed over, or reinitializing the component, etc.

For conventional memory architectures, for example, those of the bit-by-bit type, in which each stored bit can be read individually, there is a possibility of detecting such an attack based on a parity check on the bits read during a read operation. However, such an approach may not make it possible, in certain cases, to detect an attack by fault injection when the latter attack has actually taken place.

SUMMARY OF THE INVENTION

According to a first implementation and embodiment, a method of detecting an attack by fault injection on a memory device and a corresponding memory device are proposed, offering a more reliable detection of an attack by fault injection. According to one aspect, a method of detecting an attack by fault injection on a memory device including at least one group of memory cells configured to store at least one block of bits comprising data bits and m parity bits is proposed. The detection may include, when reading a block, a read of each bit of the block included in the corresponding memory cell and a parity check performed on the basis of the read value of each data bit and the read value of each parity bit.

According to a general characteristic of this aspect, the method may include inserting reference memory cells between at least some of the memory cells of the group, so as to create separate packets of m memory cells. The method may also include storing in each reference memory cell a reference bit programmed with a reference value likely to be modified during an attack by fault injection, and storing, in each packet of m memory cells, m bits of the block associated, when m is greater than 1, with different parities. The detection may further include, when reading the block, a check on the value of each reference bit.

Thus, for example, inserting reference bits at selected points of the memory plane, and storing between these reference bits of the block that have to be read associated with different parities, may make it possible to detect an attack by fault injection, even when a laser beam is sufficiently wide to illuminate two memory cells likely to include two bits of the same parity. This is because, in this case, the laser beam may also affect a reference bit by toggling its value, which may provoke an attack detection signal. Moreover, a bit associated with a given parity can be either a data bit having the parity, or even the parity bit itself relating to that parity. Although a number of placements are possible for the insertion of the reference memory cells, in particular the correspondence between the ranks of the bits and the memory cells intended to store these bits, it may be particularly advantageous to provide for insertion of a reference memory cell every m memory cells.

According to one implementation, when the memory device includes a number of groups of memory cells configured to respectively store a number of blocks of bits, each block of bits having the same number of data bits and m parity bits, and all the memory cells configured to store the bits of the same rank of the different blocks being grouped together within one and the same area of the memory plane, the reference memory cells may be inserted between at least some of the areas.

According to another aspect, a memory device may include a memory plane including at least one group of memory cells configured to store at least one block of bits including data bits and m parity bits. The memory device may also include a means of detecting, or a detector, configured to detect an attack by fault injection including a reader means, or reader, configured to read each bit of a block, and first checking means, or first checker, configured to perform, when reading a block, a parity check based on the read value of each data bit and the read value of each parity bit.

According to a general characteristic of this aspect, the memory plane may include reference memory cells arranged between at least some of the memory cells of the group so as to create separate packets of m memory cells. Each reference memory cell may store a reference bit programmed with a reference value likely to be modified during an attack by fault injection, and each packet of m memory cells may store m bits of the associated block, when m is greater than 1, with different parities. The detection means, or detector, may further include a second checking means, or second checker, configured to perform, when reading the block, a check on the value of each reference bit. According to one embodiment, a reference memory cell may be arranged every m memory cells.

According to another embodiment, wherein the memory plane includes a number of groups of memory cells configured to respectively store a number of blocks of bits, each block of bits having the same number of data bits and m parity bits, the memory cells being configured to store the bits of the same rank of the different blocks being grouped together within one and the same area of the memory plane, the reference memory cells may be arranged between at least some of the areas.

According to another aspect, an integrated circuit may incorporate a memory device as defined hereinabove. According to yet another aspect, a chip card includes an integrated circuit as defined hereinabove.

Other characteristics and advantages of the invention will become apparent from reading the detailed description of implementations and embodiments, which are by no means limiting, and from the appended drawings.

BRIEF DESCRIPTION OF THE DRAWINGS

FIGS. 4 to 7 are schematic diagrams of other possible configurations of a memory device according to the present invention.

DETAILED DESCRIPTION OF THE PREFERRED EMBODIMENTS

Figure 1:
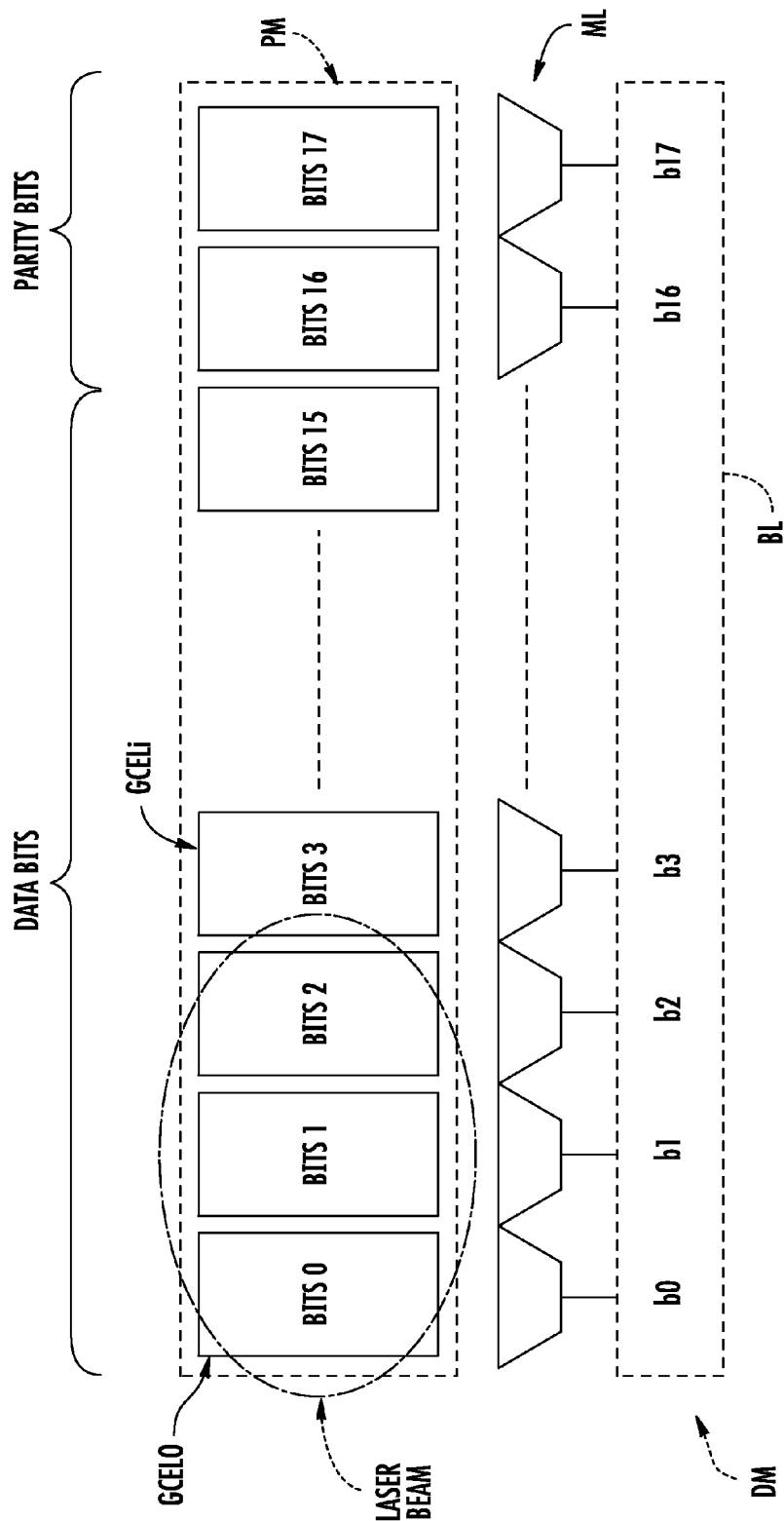
FIG. 1 is a schematic block diagram of a memory device according to the prior art.

In FIG. 1, the reference DM designates a conventional memory device whose memory plane PM includes sets of memory cells GCELi. The memory cells of one and the same set are configured to store the bits of the same rank of the different blocks of bits BL that have to be stored in the memory plane. More specifically, in the example described here, a block of bits BL that has to be stored in the memory plane includes data bits, in this case 16 (ranked 0 to 15), and parity bits, in this case two, ranked 16 and 17.

Also, for a given block BL, the memory cell CEL0 is configured to store the bit b0 of rank 0. The memory cell CEL1 is configured to store the bit b1 of rank 1 and, more generally, the memory cell CELi is configured to store the bit bi of rank i. The group of memory cells CELi is therefore configured to store the block BL.

The memory device has a bit-by-bit architecture, which means that, when a block BL is read, all the bits of the block can be read individually. In this respect, reader ML is conventionally provided that makes it possible to select the group of memory cells including a block BL to read the bits b0-b17 of this block BL.

When a laser beam touches (illuminates) a memory cell including a bit, the latter may change value and assume a fault value ("failure mode"), unless it is already programmed with a value corresponding to its fault value. For example, if the fault value of a bit is equal to 1, and this bit has a programmed value equal to 0, the fact that it is impacted by a laser ray will consequently make it switch to the value 1. However, if it was already programmed with the value 1, it will remain programmed with the value 1 when impacted with the laser beam.

To detect attacks by fault injection made, for example, by a laser beam, a parity check may be performed. In the example described in FIG. 1, two parity bits are provided, namely an even parity bit (bit b16) and an odd parity bit (bit b17). The value of the bit b16 is obtained from the sum of the values of the even data bits of the block, whereas the value of the bit b17 is obtained from the sum of the values of the odd data bits of the block.

To perform the parity check when reading the block BL, the read value of each of the even bits is used as a basis for determining a new parity bit whose value is compared with that of the read parity bit (bit b16). If there is a mismatch, an attack by fault injection can be concluded. The same operation is performed for the odd bits.

Thus, it may be possible in certain cases for the parity check to conclude there has been no attack, whereas in fact such an attack has actually taken place. More specifically, it is assumed, as illustrated in FIG. 1, that the laser beam illuminates the bits ranked 0, 1 and 2. It is also assumed that, during this illumination, the bit b0 and the bit b2 of the block have changed value, and that the odd bit b1 has not changed value during this illumination because its value already corresponded to a fault value. In such a case, the parity check on the odd bits will give no attack detection indication. Similarly, since two even bits have changed value, the parity check on the even bits will also lead to the conclusion of an absence of an attack.

Figure 2:
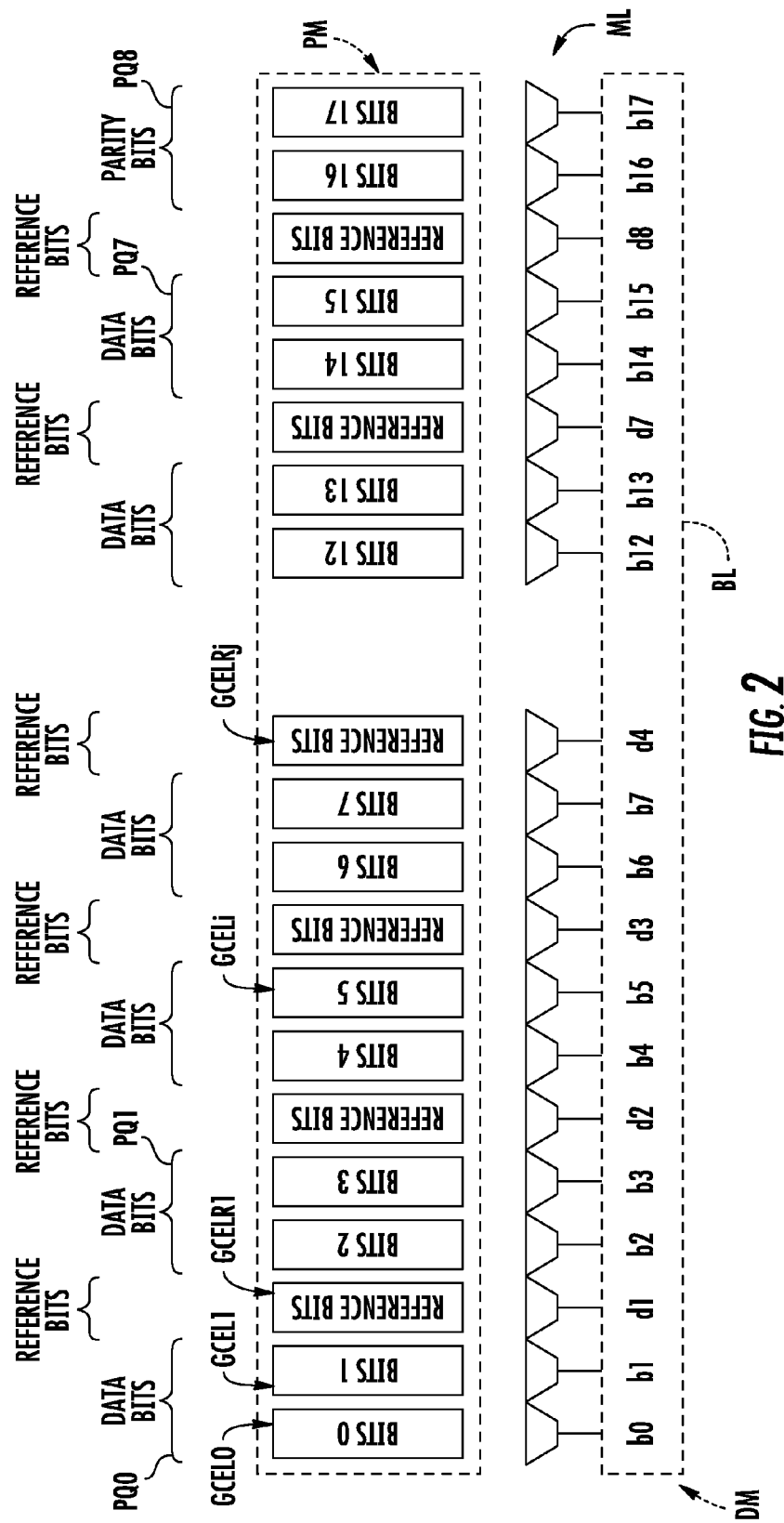
FIG. 2 is a schematic block diagram of an embodiment of a memory device according to the present invention.

FIG. 2 illustrates an exemplary embodiment of a memory device that makes it possible to remedy this drawback. More specifically, in the example described, it is still assumed that each block that has to be stored in the memory plane PM of the device DM includes n data bits and m parity bits, which in this case n=16 and m=2. In the general case m is greater than 0 and less than or equal to n. In the architecture presented here, all the memory cells CELi configured to store the bits bi ranked i of the different blocks are grouped together within sets of cells GCELi.

Also, within these different sets, each group of memory cells CEL0-CEL17 is configured to store a block BL of 18 bits b0-b17. In the example described here, the data bits of a block are the bits ranked 0 to 15 and are stored in the memory cells CEL0-CEL15, whereas the two parity bits are the bits ranked 16 and 17, which are respectively stored in the memory cells CEL16 and CEL17. If we now look at the level of a group of memory cells CEL0-CEL17 configured to store a block BL, there are, inserted between at least some of the memory cells of this group, other memory cells, identical to the memory cells of the group and in this case named reference memory cells, so as to create separate packets of m memory cells.

In the present case, m is equal to 2. Packets of two memory cells are therefore created. More specifically, the packet PQ0 is formed by the memory cells CEL0 and CEL1 whereas the packet PQ1 is formed by the memory cells CEL2 and CEL3, and so forth. The packet PQ7 is formed by the memory cells CEL14 and CEL15. The final packet, the packet PQ8, is formed by the memory cells CEL16 and CEL17.

Each reference cell CELRj includes a reference bit dj, which is programmed with a reference value likely to be modified during an attack by fault injection. In other words, if the fault value of a bit is equal to 1, each reference bit will initially be programmed with the value 0, so that the illumination of this bit by the laser beam will provoke a change in its value to the logic value 1. Moreover, m bits of the block BL are stored in each packet (in this case two bits) and are associated with different parities.

A bit associated with a given parity can be a data bit having the parity, or even the corresponding parity bit. Thus, a bit associated with an even parity can be an even data bit or the even parity bit. Similarly, a bit associated with an odd parity can be an odd data bit or the odd parity bit.

Also, it can be seen in FIG. 2 that each of the packets PQ0-PQ7 includes an odd bit and an even bit, whereas the packet PQ8 includes the even parity bit and the odd parity bit. That said, it would be possible for the even parity bit of each block to be housed, for example, in the bit ranked 2 of the packet 1 and the odd parity bit to be housed in place of the bit ranked 5. In this case, the bits ranked 2 and 5 would be housed in the packet PQ8. More generally, the correspondence between the rank of a bit of the block and the rank of a memory cell configured to store this bit is unimportant, inasmuch as the m memory cells of a packet store m bits associated with different parities.

In the case of an attack by fault injection, for example using a laser beam, if the laser beam touches, for example, only the cell CEL0 and thus changes the value of the bit b0, this attack will be detected by the even parity check. The same applies if the laser beam illuminates only the bit ranked b1 for example, and changes its value. The attack will be detected by the odd parity check.

If the laser beam simultaneously illuminates the two bits b0 and b1, the even and odd parity checks will also detect this attack. Also, if the laser beam is even wider to illuminate all the bits b0, b1, d1 and b2, the result will be a change in the reference value of the reference bit d1, which will make it possible to detect the attack. This will be the case even if the two even bits b0 and b2 have their values simultaneously changed.

If the laser beam illuminates only the odd bit b1 without modifying its value, the odd parity check will not detect this attack. However, in any case, the attack will not have modified the true value of the bit b1.

Figure 3:
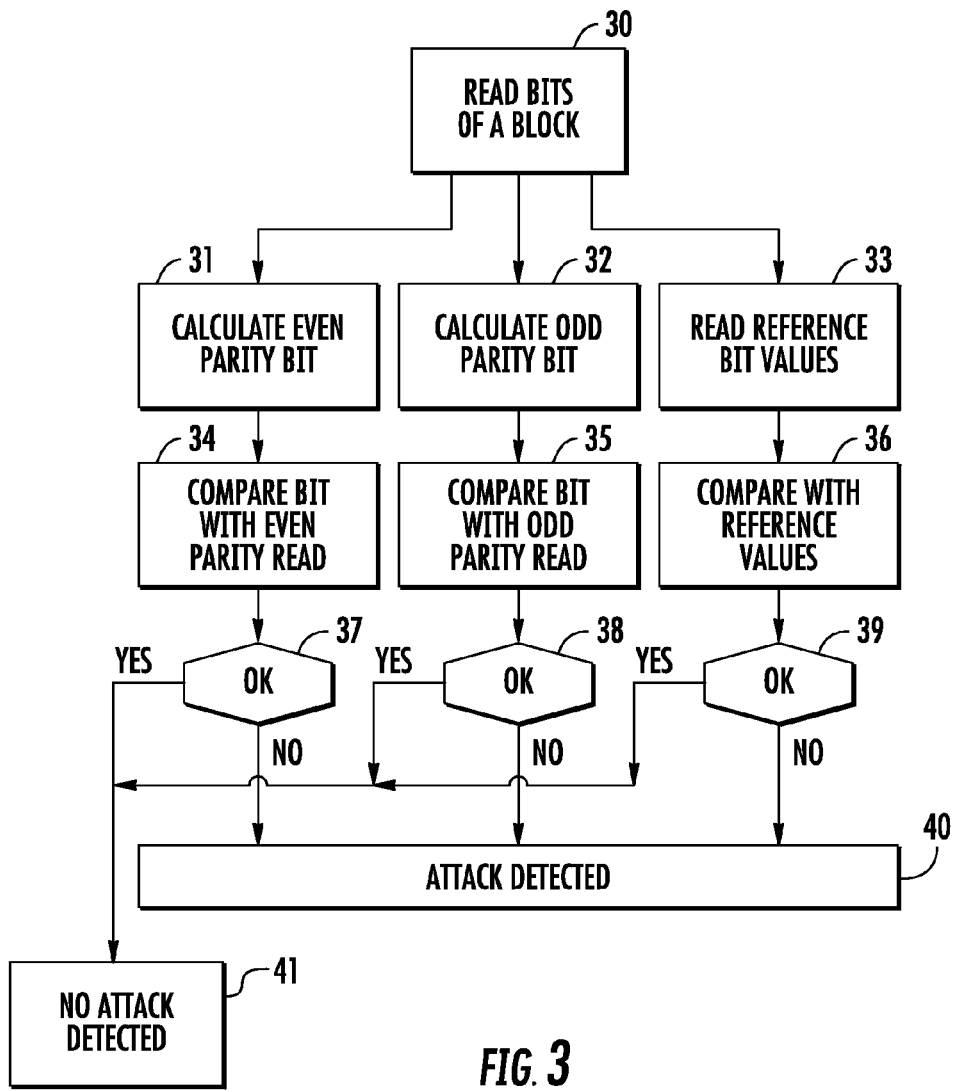
FIG. 3 is a flow chart of an attack detection method according to the present invention.

FIG. 3 summarizes the main steps of an implementation making it possible to detect an attack by fault injection. More specifically, when reading a block BL, all the bits of the block are read (step 30). An even parity bit calculation is performed (step 31) based on the value of all the even bits read. An odd parity bit calculation is also performed (step 32) based on the values of the odd bits read. A read of the values of the reference bits is also performed (step 33).

An even parity check is then performed (step 34), including a comparison of the calculated even parity bit with the read even parity bit. Similarly, an odd parity check is performed (step 35) including a comparison of the value of the calculated odd parity bit with the odd parity bit read. A comparison of the read values of the reference bits with the reference values of these bits is also performed (step 36).

In the case where all these comparisons give correct results (steps 37, 38 and 39), no attack is detected (step 41). However, if at least one of these comparisons 37, 38 and 39 gives a false logic value, then an attack by fault injection is detected (step 40).

In the example illustrated in FIG. 2, reference memory cells CELRj have been inserted every m memory cells, in this case every two memory cells. The number of reference bits is then equal to the ratio of n/m in which n is the number of data bits and m is the number of parity bits. In the example of FIG. 2, the number of reference bits is equal to 8. However, other configurations are possible, such as those for example illustrated in FIGS. 4 to 7.

In FIGS. 4 to 7, for simplicity, only the data and parity bits of a block are represented, together with the reference bits inserted between at least some of these bits. Also in these figures, these bits also correspond to the memory cells that store them.

In FIG. 4, it is assumed once again that the block includes 16 data bits ranked 1 to 15 and two parity bits, namely the bits b16 and b17. In this example, there are also, inserted every two bits of the block (or every two memory cells), a reference bit dj (corresponding to a reference memory cell). That said, instead of beginning after the bit b1, as in the case of FIG. 2, we begin after the bit b0.

In this case, 1+n/m reference bits are therefore inserted, namely, in the present case, 9 reference bits d1-d9. It can therefore be seen that, once again, the separate packets of two memory cells PQ1-PQ8 each include two bits associated with different parities. More specifically, the packets PQ1 to PQ7 each include an even data bit and an odd data bit, whereas the packet PQ8 includes the odd data bit ranked 15 (b15) and the even parity bit ranked 16 (b16).

Moreover, the bits ranked 0 and 18, namely the bits b0 and b17, stored in memory cells located opposite one another in the memory plane, form a ninth packet of two bits of the block BL associated with different parities. In practice, the bit b0 is the first even bit of the block and the bit b17 is the odd parity bit. The order of the bits and/or the rank of the bits in each packet could be modified, given that each packet stores two bits associated with different parities.

In FIG. 5, it is assumed that the block BL includes sixteen data bits (n=16) b0-b15 and four parity bits b16, b17, b18, b19 (m=4). The value of the parity bit b16 is obtained from the sum of the values of the bits ranked 4k, with k varying from 0 to 3. The value of the parity bit b17 is obtained from the sum of the values of the bits ranked 4k+1, with k varying from 0 to 3. The value of the parity bit b18 is obtained from the sum of the values of the bits ranked 4k+2, with k varying from 0 to 3. The value of the parity bit b19 is obtained from the sum of the values of the bits ranked 4k+3, with k varying from 0 to 3.

Here again, a reference memory cell including a reference bit dj is inserted every four memory cells, namely every four bits of the block. In the example of FIG. 5, this insertion begins after the bit b3 ranked 3, which leads to the insertion of four reference bits (n/m=16/4=4).

Each of the packets PQ0, PQ1, PQ2, PQ3 and PQ4 store bits associated with different parities. In the example of FIG. 5, the packet PQ4 includes all the parity bits. That said, it would be possible to distribute these parity bits within other packets PQ0, PQ1, PQ2 and PQ3 given that the remaining bits of each of these packets are associated with different parities from the parity of the parity bit that is stored therein.

In FIG. 6, once again there are sixteen data bits and four parity bits (n=16, m=4). However, the insertion of the reference bits dj begins after the bit b1 ranked 1. This leads to the insertion of five (1+n/m) reference bits d1-d5. The packets PQ1, PQ2 and PQ3 each include four data bits of different parities whereas the packet PQ4 includes two data bits (the bits b14 and b15) of different parities and the two parity bits b16 and b17 associated with the other two parities. Finally, the memory cells respectively including the bits b0, b1, b18 and b19 form a fifth packet.

In FIG. 7, it is assumed that the block has sixteen data bits b0-b15 (n=16) and one parity bit b16 (m=1) whose value is obtained from the sum of the values of all the data bits of the block. In this case, a reference bit dj is inserted between all the bits of the block, so that a reference memory cell is placed between all the memory cells configured to respectively include the data and parity bits of the block. In this example, separate packets of a memory cell including one bit of the block have again been constructed.

Figure 8:
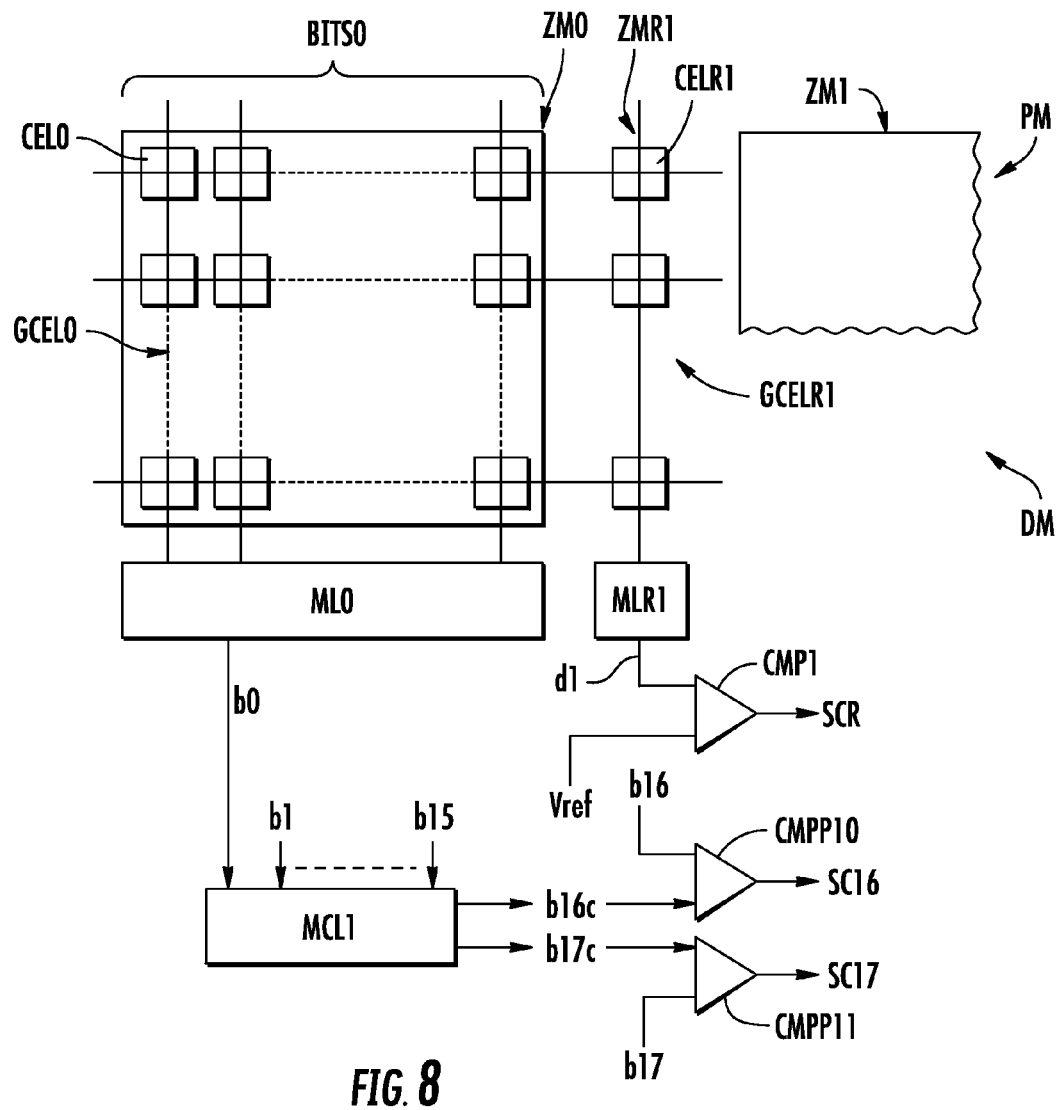
FIG. 8 is a schematic block diagram of an embodiment of a memory device according to the present invention.

Reference is now made more particularly to FIG. 8 to illustrate in more detail an exemplary embodiment of attack detection of the memory device DM. In this example, and as explained hereinabove, the memory cells, for example the cells CEL0, configured to store the bits b0 ranked 0 of the different blocks, are grouped together to form a set or matrix of memory cells GCEL0. This set GCEL0 is located within an area MO of the memory plane. The reading means, or reader, is associated with each area ZMk of the memory plane to make it possible to select the cell CEL0 including the bit b0 of the block that is to be actually read. The reader ML0 may have a structure that is conventional and includes a column decoder and reader amplification means, or amplifier. Moreover, the memory device DM also includes a row decoder, with a structure that may also be conventional, that makes it possible to select the desired row of memory cells in the memory plane.

The selection of a row and a column therefore makes it possible to deliver to the output of the reader ML0 the bit b0 ranked 0 of the block that is to be read. The different structures MLk associated with the different sets GCELk therefore respectively deliver the bits b0-b15 of the block. These data bits are processed in a calculation means, or calculator, MCL1, with a structure that is conventional, that determines the sum of the values of the even bits and the sum of the values of the odd bits to determine the calculated even and odd parity bits respectively referenced b16c and b17c. The bit b16c is then compared in a comparator CMPP10 with the even parity bit b16 extracted from the memory plane.

Similarly, the calculated parity bit b17c is compared in a comparator CMPP11 with the odd parity bit b17 extracted from the memory plane. The comparators CMPP10 and CMPP11 respectively supply signals SC16 and SC17 representative of a true or false comparison, that is to say of a nondetection of an attack, or even an attack detection.

Moreover, the reference memory cells are arranged between the different areas ZMk of the memory plane. More specifically, as illustrated in FIG. 8, there is provided in the area ZMR1 located between the area ZM0 and the area ZM1 including the memory cells configured to store the bits ranked 1 of each block, a column of reference memory cells. This set GCELR1 of reference memory cells CELR1 is linked to the reading means, or reader, MLR1 with a structure similar to that of the reading means, or reader, ML0, but without the presence of the column decoder, since the set of these reference memory cells is arranged on just one and the same column. There is a reference memory cell for each row, which will consequently be selected by the row decoder.

The reference bit d1 extracted from the selected reference cell CELR1 will be compared in a comparator CMP1 with the reference value so as to deliver a comparison signal SCR representative of a true or false value of the comparison, and consequently representative of a nondetection of an attack or of an attack detection. The comparator CMP1 therefore forms a second checking means, or second checker, configured to perform a check on the value of the corresponding reference bit.

Figure 9:
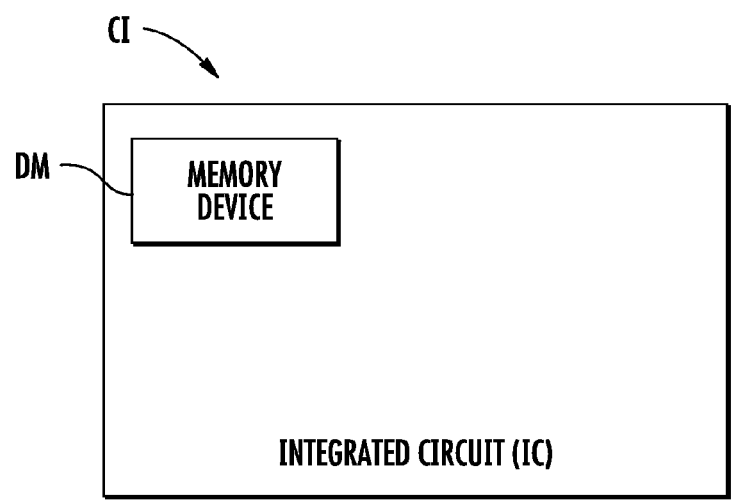
FIGS. 9 and 10 are schematic diagrams of other aspects of the present invention.
Figure 10:
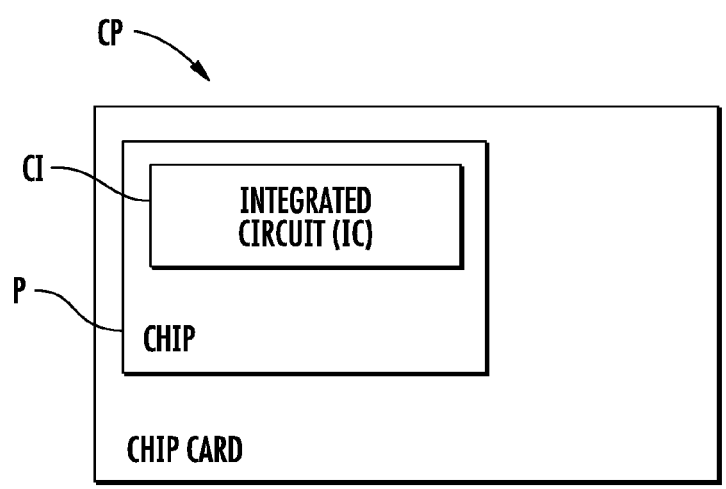

The memory device DM can advantageously be produced in an integrated fashion and inserted within an integrated circuit CI as illustrated in FIG. 9. Such an integrated circuit CI can form part of the chip P of a chip card CP (FIG. 10). The invention therefore makes it possible to improve, in a simple manner, the reliability of detecting an attack of a memory by fault injection, and can be applied to any type of memory with bit-by-bit architecture, such as, for example, ROM, RAM, FLASH, and other such memories.

That which is claimed is:

1. A method of detecting an attack by fault injection on a memory device comprising at least one group of memory cells configured to store at least one block of bits comprising data bits and m parity bits, each bit of the at least one block of bits being read into a corresponding one of the at least one group of memory cells, the method comprising:
performing a parity check based upon a read value of each data bit and a read value of each of the m parity bits;
inserting reference memory cells between at least some memory cells of the at least one group of memory cells to create separate packets of m memory cells;
storing a reference bit in each reference memory cell, the reference bit having a reference value modifiable during an attack by fault injection;
storing m bits of an associated one of the at least one block in each packet of m memory cells when m is greater than 1, the m bits being associated with different parities; and
performing a check on a value of each reference bit when reading the at least one block of bits.

2. The method according to claim 1, wherein inserting reference memory cells comprises inserting a reference memory cell every m memory cells.

3. The method according to claim 1, wherein the memory device comprises a plurality of groups of memory cells configured to respectively store a number of blocks of bits, each block of bits having a same number of data bits and m parity bits, the memory cells being configured to store bits of a same rank from different blocks and grouped together within a same area of an associated memory plane, and the reference memory cells being inserted between at least some of a plurality of same areas.

4. A method of detecting a fault injection attack comprising:
performing a parity check based upon a read value of each data bit and a read value of each of m parity bits from bits read from at least one group of memory cells;
inserting reference memory cells between each of the at least one group of memory cells to create separate packets of m memory cells;
storing a reference bit in each reference memory cell, the reference bit having a modifiable reference value;
storing m bits in each packet of memory cells, the bits being associated with different parities; and
comparing the reference value of each reference bit to a read reference value of each reference bit.

5. The method according to claim 4, wherein inserting reference memory cells comprises inserting a reference memory cell every m memory cells.

6. A memory device comprising:
a memory plane comprising
at least one group of memory cells configured to store at least one block of bits comprising data bits and m parity bits,
reference memory cells coupled between at least some memory cells of said at least one group of memory cells to create separate packets of m memory cells, each reference memory cell being configured to store a reference bit having a reference value to be modified during a fault injection attack, and
each packet of m memory cells being configured to store m bits of an associated one of the at least one block in each packet of m memory cells when m is greater than 1, the m bits being associated with different parities; and
a detector configured to detect a fault injection attack, the detector comprising
a reader configured to read each bit of the at least one block,
a first checker configured to perform, when reading a block, a parity check based on a read value of each data bit and the read value of each of the m parity bits, and
a second checker configured to perform, when reading the at least one block of bits, a check on the value of each reference bit.

7. The memory device according to claim 6, wherein the reference memory cells are arranged to have a reference memory cell every m memory cells.

8. The memory device according to claim 6, wherein the memory plane comprises a plurality of groups of memory cells configured to respectively store a number of blocks of bits, each block of bits having a same number of data bits and m parity bits, the memory cells being configured to store bits of a same rank from different blocks and grouped together within a same area of the memory plane, and the reference memory cells being arranged between at least some of a plurality of same areas.

9. The memory device according to claim 6 wherein the memory device comprises an integrated circuit.

10. The memory device according to claim 6 wherein the memory device comprises a chip card.

* * * * *